(12) United States Patent
Choi et al.

(10) Patent No.: US 8,164,257 B2
(45) Date of Patent: Apr. 24, 2012

(54) ORGANIC LIGHT EMITTING DISPLAY AND METHOD OF FABRICATING THE SAME

(75) Inventors: Dong Soo Choi, Suwon-si (KR); Jin Woo Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 766 days.

(21) Appl. No.: 11/540,103

(22) Filed: Sep. 29, 2006

(65) Prior Publication Data

US 2007/0170859 A1    Jul. 26, 2007

(30) Foreign Application Priority Data

Jan. 25, 2006 (KR) .......................... 10-2006-0007962
Mar. 27, 2006 (KR) .......................... 10-2006-0027321

(51) Int. Cl.
*H05B 33/12* (2006.01)
(52) U.S. Cl. ......................... 313/512; 313/504
(58) Field of Classification Search .......... 313/498–512; 315/169.3; 345/36, 45, 76
See application file for complete search history.

(56) References Cited

U.S. PATENT DOCUMENTS

| | | |
|---|---|---|
| 3,966,449 A | 6/1976 | Foster |
| 4,105,292 A | 8/1978 | Conder et al. |
| 4,238,704 A | 12/1980 | Bonk et al. |
| 4,702,566 A | 10/1987 | Tukude |

(Continued)

FOREIGN PATENT DOCUMENTS

CN          1290121 A       4/2001
(Continued)

OTHER PUBLICATIONS

Office Action issued by the Chinese Patent Office on Aug. 1, 2008 to Chinese Patent Application No. 200710001301.6 with English translation.
Japanese Office Action issued Sep. 8, 2009 in Japanese Patent Application 2007-011996.
Japan Office Action dated Jul. 28, 2009 of the Japanese Patent Application No. 2006-153567.
Japan Office Action dated Jul. 28, 2009 of the Japanese Patent Application No. 2006 178508.

(Continued)

*Primary Examiner* — Nimeshkumar Patel
*Assistant Examiner* — Christopher Raabe
(74) *Attorney, Agent, or Firm* — Knobbe Martens Olson & Bear LLP

(57) ABSTRACT

Disclosed are an organic light emitting display and a method of fabricating the same that are capable of preventing deterioration of adhesive strength of a glass frit for sealing a substrate. An organic light emitting device according to one embodiment of the present invention includes a first substrate including a pixel region and a non-pixel region, an array of organic light emitting pixels formed over the pixel region of the first substrate, and a second substrate placed over the first substrate, the array being interposed between the first and second substrates. The organic light emitting device of this embodiment further includes an electrically conductive line formed over the non-pixel region of the first substrate, and a frit seal interposed between the first and second substrates and surrounding the array such that the array is encapsulated by the first substrate, the second substrate and the frit seal, wherein the electrically conductive line comprises a portion overlapping the frit seal in a segment of the device such that the portion of the electrically conductive line substantially eclipses the frit seal when viewed from the first substrate.

24 Claims, 10 Drawing Sheets

U.S. PATENT DOCUMENTS

| | | |
|---|---|---|
| 4,826,297 A | 5/1989 | Kubo et al. |
| 4,984,059 A | 1/1991 | Kubota et al. |
| 5,808,719 A | 9/1998 | Fujiwara et al. |
| 5,811,927 A | 9/1998 | Anderson et al. |
| 5,965,907 A | 10/1999 | Huang et al. |
| 6,005,653 A | 12/1999 | Matsuzawa |
| 6,087,717 A | 7/2000 | Ano et al. |
| 6,195,142 B1 | 2/2001 | Gyotoku et al. |
| 6,210,815 B1 | 4/2001 | Ooishi |
| 6,211,938 B1 | 4/2001 | Mori |
| 6,288,487 B1 | 9/2001 | Arai |
| 6,424,009 B1 | 7/2002 | Ju |
| 6,452,323 B1 | 9/2002 | Byrum et al. |
| 6,489,719 B1 | 12/2002 | Young et al. |
| 6,495,262 B2 | 12/2002 | Igeta |
| 6,515,417 B1 | 2/2003 | Duggal et al. |
| 6,551,724 B2 | 4/2003 | Ishii et al. |
| 6,554,672 B2 | 4/2003 | Dunham et al. |
| 6,555,025 B1 | 4/2003 | Krupetsky et al. |
| 6,565,400 B1 | 5/2003 | Lee et al. |
| 6,590,337 B1 | 7/2003 | Nishikawa et al. |
| 6,603,254 B1 | 8/2003 | Ando |
| 6,605,826 B2 | 8/2003 | Yamazaki et al. |
| 6,624,572 B1 | 9/2003 | Kim et al. |
| 6,646,284 B2 | 11/2003 | Yamazaki et al. |
| 6,650,392 B1 | 11/2003 | Iwangaga et al. |
| 6,660,547 B2 | 12/2003 | Guenther |
| 6,671,029 B1 | 12/2003 | Choi |
| 6,717,052 B2 | 4/2004 | Wang et al. |
| 6,744,199 B1 | 6/2004 | Tanaka |
| 6,791,660 B1 | 9/2004 | Hayashi et al. |
| 6,831,725 B2 | 12/2004 | Niiya |
| 6,833,668 B1 | 12/2004 | Yamada et al. |
| 6,861,801 B2 | 3/2005 | Kim et al. |
| 6,878,467 B2 | 4/2005 | Chung et al. |
| 6,896,572 B2 | 5/2005 | Park et al. |
| 6,914,661 B2 | 7/2005 | Masuda et al. |
| 6,924,594 B2 | 8/2005 | Ogura et al. |
| 6,936,963 B2 | 8/2005 | Langer et al. |
| 6,956,324 B2 | 10/2005 | Yamazaki |
| 6,956,638 B2 | 10/2005 | Akiyama et al. |
| 6,965,195 B2 | 11/2005 | Yamazaki et al. |
| 6,980,275 B1 | 12/2005 | Konuma et al. |
| 6,993,537 B2 | 1/2006 | Buxton et al. |
| 6,998,776 B2 | 2/2006 | Aitken et al. |
| 7,030,558 B2 | 4/2006 | Park et al. |
| 7,098,589 B2 | 8/2006 | Erchak et al. |
| 7,112,115 B1 | 9/2006 | Yamazaki et al. |
| 7,141,925 B2 | 11/2006 | Wittmann et al. |
| 7,154,218 B2 | 12/2006 | Murakami et al. |
| 7,178,927 B2 | 2/2007 | Seo |
| 7,186,020 B2 | 3/2007 | Taya et al. |
| 7,187,121 B2 | 3/2007 | Hasegawa et al. |
| 7,193,218 B2 | 3/2007 | Nagano |
| 7,193,364 B2 | 3/2007 | Klausmann et al. |
| 7,193,366 B2 | 3/2007 | Tomimatsu et al. |
| 7,202,602 B2 | 4/2007 | Anandan |
| 7,211,938 B2 | 5/2007 | Tanaka |
| 7,214,429 B2 | 5/2007 | Kato et al. |
| 7,247,986 B2 | 7/2007 | Kang et al. |
| 7,255,823 B1 | 8/2007 | Guether et al. |
| 7,291,977 B2 | 11/2007 | Kim et al. |
| 7,306,346 B2 | 12/2007 | Fukuoka et al. |
| 7,317,281 B2 | 1/2008 | Hayashi et al. |
| 7,332,858 B2 | 2/2008 | Nomura et al. |
| 7,342,357 B2 | 3/2008 | Sakano et al. |
| 7,344,901 B2 | 3/2008 | Hawtof et al. |
| 7,359,021 B2 | 4/2008 | Ota et al. |
| 7,371,143 B2 | 5/2008 | Becken et al. |
| 7,393,257 B2 | 7/2008 | Spencer et al. |
| 7,407,423 B2 | 8/2008 | Aitken et al. |
| 7,423,375 B2 | 9/2008 | Guenther et al. |
| 7,425,166 B2 | 9/2008 | Burt et al. |
| 7,425,518 B2 | 9/2008 | Yoshida et al. |
| 7,426,010 B2 | 9/2008 | Lee et al. |
| 7,452,738 B2 | 11/2008 | Hayashi et al. |
| 7,474,375 B2 | 1/2009 | Kwak et al. |
| 7,498,186 B2 | 3/2009 | Lee |
| 7,514,280 B2 | 4/2009 | Lee |
| 7,528,544 B2 | 5/2009 | Kwak et al. |
| 7,537,504 B2 | 5/2009 | Becken et al. |
| 7,564,185 B2 | 7/2009 | Song et al. |
| 7,579,203 B2 | 8/2009 | Yamazaki et al. |
| 7,579,220 B2 | 8/2009 | Ohnuma et al. |
| 7,585,022 B2 | 9/2009 | Achilles et al. |
| 7,586,254 B2 | 9/2009 | Kwak et al. |
| 7,597,603 B2 | 10/2009 | Becken et al. |
| 7,821,197 B2 | 10/2010 | Lee |
| 7,825,594 B2 | 11/2010 | Lee et al. |
| 7,834,550 B2 | 11/2010 | Lee et al. |
| 7,837,530 B2 | 11/2010 | Park |
| 2002/0084464 A1 | 7/2002 | Yamazaki et al. |
| 2003/0066311 A1 | 4/2003 | Li et al. |
| 2003/0077396 A1 | 4/2003 | Lecompte et al. |
| 2003/0227252 A1 | 12/2003 | Ikeya et al. |
| 2004/0069017 A1 | 4/2004 | Li et al. |
| 2004/0075380 A1 | 4/2004 | Takemoto et al. |
| 2004/0104655 A1 | 6/2004 | Kodera et al. |
| 2004/0135520 A1 | 7/2004 | Park et al. |
| 2004/0150319 A1 | 8/2004 | Tomimatsu et al. |
| 2004/0169033 A1 | 9/2004 | Kuibira et al. |
| 2004/0169174 A1 | 9/2004 | Huh et al. |
| 2004/0201348 A1 | 10/2004 | Anandan |
| 2004/0206953 A1 | 10/2004 | Morena et al. |
| 2004/0263740 A1* | 12/2004 | Sakakura et al. ............. 349/138 |
| 2005/0001545 A1* | 1/2005 | Aitken et al. .................. 313/512 |
| 2005/0023956 A1* | 2/2005 | Kwak et al. .................... 313/495 |
| 2005/0046338 A1 | 3/2005 | Park et al. |
| 2005/0127820 A1 | 6/2005 | Yamazaki et al. |
| 2005/0195355 A1 | 9/2005 | Kwak et al. |
| 2005/0218396 A1 | 10/2005 | Tsuchiya et al. |
| 2005/0231107 A1 | 10/2005 | Yamazaki et al. |
| 2005/0248270 A1 | 11/2005 | Ghosh et al. |
| 2005/0275342 A1 | 12/2005 | Yanagawa |
| 2006/0082298 A1 | 4/2006 | Becken et al. |
| 2006/0084348 A1 | 4/2006 | Becken et al. |
| 2006/0284556 A1 | 12/2006 | Tremel et al. |
| 2006/0290261 A1 | 12/2006 | Sawai et al. |
| 2007/0120478 A1 | 5/2007 | Lee et al. |
| 2007/0170324 A1 | 7/2007 | Lee et al. |
| 2007/0170423 A1 | 7/2007 | Choi et al. |
| 2007/0170605 A1 | 7/2007 | Lee et al. |
| 2007/0170839 A1 | 7/2007 | Choi et al. |
| 2007/0170845 A1 | 7/2007 | Choi et al. |
| 2007/0170850 A1 | 7/2007 | Choi et al. |
| 2007/0170855 A1 | 7/2007 | Choi et al. |
| 2007/0170857 A1 | 7/2007 | Choi et al. |
| 2007/0170860 A1 | 7/2007 | Choi et al. |
| 2007/0170861 A1 | 7/2007 | Lee et al. |
| 2007/0171637 A1 | 7/2007 | Choi |
| 2007/0172971 A1 | 7/2007 | Boroson |
| 2007/0173167 A1 | 7/2007 | Choi et al. |
| 2007/0176549 A1 | 8/2007 | Park |
| 2007/0177069 A1 | 8/2007 | Lee |
| 2007/0197120 A1 | 8/2007 | Lee |
| 2007/0232182 A1 | 10/2007 | Park |
| 2008/0074036 A1 | 3/2008 | Wang et al. |

FOREIGN PATENT DOCUMENTS

| | | |
|---|---|---|
| CN | 1438825 | 8/2003 |
| CN | 1551686 A | 12/2004 |
| CN | 1577413 | 2/2005 |
| CN | 161636 | 5/2005 |
| CN | 1212662 | 7/2005 |
| CN | 1670570 | 9/2005 |
| EP | 1 575 090 | 9/2005 |
| EP | 1 777 748 | 4/2007 |
| JP | 030-37933 | 2/1991 |
| JP | 04-147217 | 5/1992 |
| JP | 04-301879 | 10/1992 |
| JP | 06-34983 | 2/1994 |
| JP | 06-337429 | 10/1994 |
| JP | 07-74583 | 3/1995 |
| JP | 09-258671 | 3/1997 |
| JP | 09-278483 | 10/1997 |
| JP | 10-74583 | 3/1998 |
| JP | 10-074583 | 3/1998 |

| | | |
|---|---|---|
| JP | 10-125463 | 5/1998 |
| JP | 10-161137 | 6/1998 |
| JP | 63-163423 | 7/1998 |
| JP | 10-201585 | 8/1998 |
| JP | 11-007031 | 1/1999 |
| JP | 11-202349 | 7/1999 |
| JP | 2001-022293 | 1/2001 |
| JP | 2001-052858 | 2/2001 |
| JP | 2001-55527 | 2/2001 |
| JP | 2001-203076 | 2/2001 |
| JP | 2001-110564 | 4/2001 |
| JP | 2001-230072 | 8/2001 |
| JP | 2001-319775 | 11/2001 |
| JP | 2002 020169 | 1/2002 |
| JP | 2002-93576 | 3/2002 |
| JP | 2002-100472 | 4/2002 |
| JP | 2002 117777 | 4/2002 |
| JP | 2002 170664 | 6/2002 |
| JP | 2002-216951 | 8/2002 |
| JP | 2002-280169 | 9/2002 |
| JP | 2002-318547 | 10/2002 |
| JP | 2001-324662 | 11/2002 |
| JP | 2002-359070 | 12/2002 |
| JP | 2003-123966 | 4/2003 |
| JP | 2003-228302 | 8/2003 |
| JP | 2003 243160 | 8/2003 |
| JP | 2003 297552 | 10/2003 |
| JP | 2003-332061 | 11/2003 |
| JP | 2004 29552 | 1/2004 |
| JP | 2004 070351 | 3/2004 |
| JP | 04-151656 | 5/2004 |
| JP | 2004 303733 | 10/2004 |
| JP | 2004 319103 | 11/2004 |
| JP | 2005-049808 | 2/2005 |
| JP | 2005-71984 | 3/2005 |
| JP | 2005-112676 | 4/2005 |
| JP | 2005-510831 | 4/2005 |
| JP | 2005-123089 | 5/2005 |
| JP | 2005 158672 | 6/2005 |
| JP | 2005 190683 | 7/2005 |
| JP | 2005-216746 | 8/2005 |
| JP | 2005-222807 | 8/2005 |
| JP | 2005 251415 | 9/2005 |
| JP | 2005 258405 | 9/2005 |
| JP | 2005-302707 | 10/2005 |
| JP | 2005-302738 | 10/2005 |
| JP | 2005 340020 | 12/2005 |
| JP | 2006 524419 | 10/2006 |
| KR | 10-1995-0009817 | 4/1995 |
| KR | 10-1998-0017583 | 6/1998 |
| KR | 10-2000-0045292 | 7/2000 |
| KR | 10-2001-0079597 | 8/2001 |
| KR | 10-2001-0084380 | 9/2001 |
| KR | 10-2002-0051153 | 6/2002 |
| KR | 10-2003-0044656 | 6/2003 |
| KR | 10-2003-0089447 | 11/2003 |
| KR | 10-2004-0011138 | 2/2004 |
| KR | 10-2005-0024592 | 3/2005 |
| KR | 10-2005-070543 | 7/2005 |
| KR | 10-2005-0076664 | 7/2005 |
| KR | 10-2005-0112318 | 11/2005 |
| KR | 10-2005-0115408 | 12/2005 |
| KR | 10-2006-0005369 | 1/2006 |
| TW | 508976 | 11/2002 |
| TW | 564563 | 12/2003 |
| TW | 569166 | 1/2004 |
| TW | I227094 | 1/2005 |
| TW | I228686 | 3/2005 |
| TW | I237218 | 8/2005 |
| TW | 200541379 | 12/2005 |
| TW | 200541382 | 12/2005 |
| TW | I1277125 | 3/2007 |
| WO | WO 02/21557 | 3/2002 |
| WO | WO 03/005774 | 1/2003 |
| WO | WO 2004-095597 | 4/2004 |
| WO | WO 2004/094331 | 11/2004 |
| WO | WO 2004/095597 | 11/2004 |
| WO | WO 2004/112160 | 12/2004 |
| WO | WO 2005/050751 | 6/2005 |
| WO | WO 2006/045067 | 4/2006 |

OTHER PUBLICATIONS

Japan Office Action dated Jul. 14, 2009 of the Japanese Patent Application No. 2006-151960.
Japan Office Action dated Jul. 14, 2009 of the Japanese Patent Application No. 2006-165210.
Chinese Office Action in corresponding Patent Application No. 200710000143.2 dated Sep. 26, 2008.
Chinese Office Action issued Oct. 10, 2008 in corresponding Patent Application No. 2007100040808.
Chinese Office Action issued Oct. 10, 2008 in Corresponding Patent Application No. 200710003941.0 with its English translation—11 pages.
Chinese Office Action issued Oct. 10, 2008 in Patent Application No. 200710001782.0.
Chinese Office Action issued on Aug. 1, 2008 in corresponding Patent Application No. 2007100015717 in 19 pages.
Chinese Office Action Issued on Dec. 19, 2008 in Corresponding Patent Application No. 2007100072531 with its English translation—13 pages.
Chinese Rejection Decision issued on May 8, 2009 in the corresponding Patent Application No. 200710004080.8.
Chinese Office Action issued on Jan. 8, 2010 in corresponding Patent Application No. 200710003941.0.
European Search Report from the corresponding European Patent Application No. 07101294.2 dated Jun. 6, 2007.
European Search Report from the corresponding European Patent Application No. 07101295.9 dated May 24, 2007.
Japanese Office Action dated Dec. 1, 2009 for Japanese Patent Application No. 2006-193033, which claims priority of the corresponding Korean priority Application No. 10-2006-0007893.
Japanese Office Action mailed Jun. 30, 2009 for Japanese Application No. 2006-222065.
Japanese Office Action dated Jul. 28, 2009 of the Japanese Patent Application No. 2006-153567, which claims priority of the corresponding Korean priority application No. 10-2006-0008462.
Japanese Office Action for Patent Application No. 2006-1930232 mailed May 19, 2009.
Japanese Office Action issued on May 19, 2009 in the corresponding Japanese Patent Application No. 2006-189628.
Japanese Office Action issued on Oct. 20, 2009 in the corresponding Japanese Patent Application No. 2006-189628.
Japanese Office Action issued on Oct. 27, 2009 in the corresponding Japanese Patent Application No. 2006-256002.
Japanese Office Action re Patent Application No. 2006-193034 mailed May 19, 2009.
Korean Notice of Allowance issued Aug. 2, 2007 in counterpart Korean Patent Application No. 10-2006-0016188.
Korean Notice of Allowance issued Jul. 3, 2007 in counterpart Korean Patent Application No. 10-2006-0035455.
Korean Office Action from corresponding Patent Application No. 10-2006-0006148 dated Sep. 26, 2006.
Korean Office Action from corresponding Patent Application No. 10-2006-0007890, dated Sep. 26, 2006.
Korean Office Action from corresponding Patent Application No. 10-2006-0007963, dated Sep. 26, 2006.
Korean Office Action issued Feb. 12, 2007 in counterpart Korean Patent Application No. 10-2006-0035455.
Taiwanese Office Action issued Jan. 18, 2010 from corresponding TW Application No. 95145107 (which claims priority to KR App. No. 10-2006-0008463).
U.S. Office Action dated Feb. 2, 2009 in U.S. Appl. No. 11/529,916.
U.S. Office Action dated Apr. 3, 2009 in U.S. Appl. No. 11/529,891.
U.S. Office Action dated Apr. 3, 2009 in U.S. Appl. No. 11/541,055.
U.S. Office Action dated Aug. 19, 2009 in U.S. Appl. No. 11/529,914.
U.S. Office Action dated Dec. 30, 2009 in U.S. Appl. No. 11/541,139.
U.S. Office Action dated Nov. 5, 2009 in U.S. Appl. No. 11/541,047.
U.S. Office Action dated Nov. 28, 2007 in U.S. Appl. No. 11/540,150.
U.S. Office Action dated Aug. 21, 2008 in U.S. Appl. No. 11/540,150.

U.S. Office Action dated Nov. 15, 2007 in U.S. Appl. No. 11/541,009.
U.S. Office Action dated Jun. 19, 2008 in U.S. Appl. No. 11/541,009.
U.S. Office Action dated Dec. 3, 2008 in U.S. Appl. No. 11/541,009.
U.S. Office Action dated Apr. 30, 2009 in U.S. Appl. No. 11/540,151.
U.S. Office Action dated Feb. 11, 2009 in U.S. Appl. No. 11/529,883.
U.S. Office Action dated Jul. 17, 2009 in U.S. Appl. No. 11/529,883.
U.S. Office Action dated Dec. 30, 2009 in U.S. Appl. No. 11/541,048.
U.S. Office Action dated Dec. 8, 2008 in U.S. Appl. No. 11/540,021.
U.S. Office Action dated Apr. 27, 2009 in U.S. Appl. No. 11/540,021.
U.S. Office Action dated Feb. 19, 2009 in U.S. Appl. No. 11/540,024.
U.S. Office Action dated May 4, 2009 in U.S. Appl. No. 11/529,995.
U.S. Office Action dated May 8, 2009 in U.S. Appl. No. 11/540,149.
U.S. Appl. No. 11/540,024, filed Sep. 29, 2006, Published as 2007/0170605 on Jul. 26, 2007, and its ongoing prosecution history, including without limitation Office Actions, Amendments, Remarks, and any other potentially relevant documents.
U.S. Appl. No. 11/540,149, filed Sep. 29, 2006, Published as 2007/0170324 on Jul. 26, 2007, and its ongoing prosecution history, including without limitation Office Actions, Amendments, Remarks, and any other potentially relevant documents.
U.S. Appl. No. 11/540,021, filed Sep. 29, 2006, Published as 2007/0170423 on Jul. 26, 2007, and its ongoing prosecution history, including without limitations Office Actions, Amendments Remarks, and any other potentially relevant documents.
U.S. Appl. No. 11/541,047, filed Sep. 29, 2006, Published as 2007/0170839 on Jul. 26, 2007, and its ongoing prosecution history, including without limitation Office Actions, Amendments, Remarks, and any other potentially relevant documents.
U.S. Appl. No. 11/541,139, filed Sep. 29, 2006, Published as 2007/0170845 on Jul. 26, 2007, and its ongoing prosecution history, including without limitation Office Actions, Amendments, Remarks, and any other potentially relevant documents.
U.S. Appl. No. 11/529,916, filed Sep. 29, 2006, Published as 2007/0170850 on Jul. 26, 2007, and its ongoing prosecution history, including without limitation Office Actions, Amendments, Remarks, and any other potentially relevant documents.
U.S. Appl. No. 11/529,891, filed Sep. 29, 2006, Published as 2007/0170855 on Jul. 26, 2007, and its ongoing prosecution history, including without limitation Office Actions, Amendments, Remarks, and any other potentially relevant documents.
U.S. Appl. No. 11/529,914, filed Sep. 29, 2006, Published as 2007/0170857 on Jul. 26, 2007, and its ongoing prosecution history, including without limitation Office Actions, Amendments, Remarks, and any other potentially relevant documents.
U.S. Appl. No. 11/540,151, filed Sep. 29, 2006, Published as 2007/0170860 on Jul. 26, 2007, and its ongoing prosecution history, including without limitation Office Actions, Amendments, Remarks, and any other potentially relevant documents.
U.S. Appl. No. 11/540,157, filed Sep. 29, 2006, Published as 2007/0170861 on Jul. 26, 2007, and its ongoing prosecution history, including without limitation Office Actions, Amendments, Remarks, and any other potentially relevant documents.
U.S. Appl. No. 11/529,995, filed Sep. 29, 2006, Published as 2007/0171637 on Jul. 26, 2007, and its ongoing prosecution history, including without limitation Office Actions, Amendments, Remarks, and any other potentially relevant documents.
U.S. Appl. No. 11/541,055, filed Sep. 29, 2006, Published as 2007/0173167 on Jul. 26, 2007, and its ongoing prosecution history, including without limitation Office Actions, Amendments, Remarks, and any other potentially relevant documents.
U.S. Appl. No. 11/541,009, filed Sep. 29, 2006, Published as 2007/0176549 on Aug. 2, 2007, and its ongoing prosecution history, including without limitation Office Actions, Amendments, Remarks, and any other potentially relevant documents.
U.S. Appl. No. 11/541,048, filed Sep. 29, 2006, Published as 2007/0177069 on Aug. 2, 2007, and its ongoing prosecution history, including without limitation Office Actions, Amendments, Remarks, and any other potentially relevant documents.
U.S. Appl. No. 11/529,883, filed Sep. 29, 2006, Published as 2007/0197120 on Aug. 23, 2007, and its ongoing prosecution history, including without limitation Office Actions, Amendments, Remarks, and any other potentially relevant documents.
U.S. Appl. No. 11/540,008, filed Sep. 29, 2006, Published as 2007/0232182 on Oct. 4, 2007, and its ongoing prosecution history, including without limitation Office Actions, Amendments, Remarks, and any other potentially relevant documents.
U.S. Appl. No. 11/670,356, filed Feb. 1, 2007, Published as 2008/0074036 on Mar. 27, 2008, and its ongoing prosecution history, including without limitation Office Actions, Amendments, Remarks, and any other potentially relevant documents.
European Search Report from European Patent Application No. 07250311.3 dated Sep. 24, 2010.
European Extended Search Report from the corresponding European Patent Application No. 07250267.7 dated Jan. 5, 2011.
U.S. Office Action dated Nov. 29, 2010 in U.S. Appl. No. 11/529,916.
U.S. Appl. No. 11/540,150, filed Sep. 29, 2006, and its ongoing prosecution history, including without limitation Office Actions, Amendments, Remarks, and any other potentially relevant documents.
Japanese Office Action dated Jun. 15, 2010 from Patent Application No. 2006-151960.
Taiwanese Office Action issued Jan. 18, 2010 from Application No. 95145107.
Taiwanese Office Action Issued Apr. 2, 2010 from Application No. 95144932.
U.S. Office Action (Advisory Action) dated May 19, 2010 in U.S. Appl. No. 11/529,914.
U.S. Office Action dated Aug. 19, 2010 in U.S. Appl. No. 11/529,914.
U.S. Office Action dated May 25, 2010 in U.S. Appl. No. 11/529,995.

* cited by examiner

ORGANIC LIGHT EMITTING DISPLAY AND METHOD OF FABRICATING THE SAME

CROSS-REFERENCE TO RELATED APPLICATIONS

This application claims priority to and the benefit of Korean Patent Application Nos. 10-2006-0007962, filed Jan. 25, 2006, and 10-2006-0027321, filed Mar. 27, 2006, the disclosures of which are incorporated herein by reference in their entirety. This application is related to and incorporates herein by reference the entire contents of the following concurrently filed applications:

| Title | Filing Date | Application No. |
|---|---|---|
| ORGANIC LIGHT-EMITTING DISPLAY DEVICE AND METHOD OF FABRICATING THE SAME | Sep. 29, 2006 | 11/541,055 |
| ORGANIC LIGHT-EMITTING DISPLAY DEVICE AND METHOD OF MANUFACTURING THE SAME | Sep. 29, 2006 | 11/529,914 |
| ORGANIC LIGHT EMITTING DISPLAY DEVICE | Sep. 29, 2006 | 11/541,139 |
| ORGANIC LIGHT-EMITTING DISPLAY DEVICE WITH FRIT SEAL AND REINFORCING STRUCTURE | Sep. 29, 2006 | 11/541,047 |
| ORGANIC LIGHT EMITTING DISPLAY DEVICE METHOD OF FABRICATING THE SAME | Sep. 29, 2006 | 11/540,150 |
| ORGANIC LIGHT EMITTING DISPLAY AND METHOD OF FABRICATING THE SAME | Sep. 29, 2006 | 11/541,009 |
| ORGANIC LIGHT-EMITTING DISPLAY DEVICE WITH FRIT SEAL AND REINFORCING STRUCTURE BONDED TO FRAME | Sep. 29, 2006 | 11/540,151 |
| METHOD FOR PACKAGING ORGANIC LIGHT EMITTING DISPLAY WITH FRIT SEAL AND REINFORCING STRUCTURE | Sep. 29, 2006 | 11/529,910 |
| METHOD FOR PACKAGING ORGANIC LIGHT EMITTING DISPLAY WITH FRIT SEAL AND REINFORCING STRUCTURE | Sep. 29, 2006 | 11/540,084 |
| ORGANIC LIGHT-EMITTING DISPLAY DEVICE AND THE PREPARATION METHOD OF THE SAME | Sep. 29, 2006 | 11/540,008 |
| ORGANIC LIGHT EMITTING DISPLAY AND FABRICATING METHOD OF THE SAME | Sep. 29, 2006 | 11/541,048 |
| ORGANIC LIGHT-EMITTING DISPLAY AND METHOD OF MAKING THE SAME | Sep. 29, 2006 | 11/540,021 |
| ORGANIC LIGHT EMITTING DISPLAY AND FABRICATING METHOD OF THE SAME | Sep. 29, 2006 | 11/540,024 |
| ORGANIC LIGHT EMITTING DISPLAY DEVICE AND MANUFACTURING METHOD THEREOF | Sep. 29, 2006 | 11/529,995 |
| ORGANIC LIGHT-EMITTING DISPLAY DEVICE AND MANUFACTURING METHOD OF THE SAME | Sep. 29, 2006 | 11/540,157 |
| ORGANIC LIGHT EMITTING DISPLAY AND FABRICATING METHOD OF THE SAME | Sep. 29, 2006 | 11/540,149 |
| ORGANIC LIGHT EMITTING DISPLAY AND METHOD OF FABRICATING THE SAME | Sep. 29, 2006 | 11/529,916 |
| ORGANIC LIGHT EMITTING DISPLAY DEVICE METHOD OF FABRICATING THE SAME | Sep. 29, 2006 | 11/529,891 |

BACKGROUND OF THE INVENTION

1. Field of the Invention

The present invention relates to organic light emitting display devices. More particularly, the present invention relates to packaging organic light emitting display devices.

2. Description of the Related Art

With the goal of improving upon the shortcomings of conventional displays such as cathode ray tubes, attention has recently been focused on flat panel displays such as liquid crystal displays, organic light emitting displays, plasma display panels (PDP), and so on.

Since the liquid crystal display is a passive device rather than an emissive device, it is difficult to make having high brightness and contrast, a wide viewing angle, and a large-sized screen. While the PDP is an emissive device, it is heavy, consumes much power, and requires a complex manufacturing process, compared to other displays.

Meanwhile, since the organic light emitting display (OLED) is an emissive device, it has a wide viewing angle, and high contrast. In addition, since it does not require a backlight, it can be made lightweight, compact, and power efficient. Further, the OLED can be driven at a low DC voltage, has a rapid response speed, and is formed entirely of solid material. As a result, the OLED has the ability to withstand external impact and a wide range of temperatures, and can be fabricated by a simple method at low cost.

The discussion of this section is to provide a general background of organic light-emitting devices and does not constitute an admission of prior art.

SUMMARY OF CERTAIN INVENTIVE ASPECTS

One aspect of the invention provides an organic light emitting device. This device includes a first substrate comprising a pixel region and a non-pixel region, an array of organic light emitting pixels formed over the pixel region of the first substrate, and a second substrate placed over the first substrate, the array being interposed between the first and second substrate. The device further includes an electrically conductive line formed over the non-pixel region of the first substrate, and a frit seal interposed between the first and second substrates and surrounding the array such that the array is encapsulated by the first substrate, the second substrate and the frit seal, wherein the electrically conductive line comprises a portion overlapping the frit seal in a segment of the device such that the portion of the electrically conductive line substantially eclipses the frit seal when viewed from the first substrate.

In the above-described device, the portion of the electrically conductive line may substantially totally eclipse the frit seal when viewed from the first substrate. The frit seal may contact the electrically conductive line. There may be substantially no organic material between the frit seal and the electrically conductive line. The device may further comprise at least one layer located between the electrically conductive line and the first substrate, the at least one layer comprising an organic material. The electrically conductive material may further comprise a portion that does not overlap the frit seal. The electrically conductive line may extend along a peripheral edge of the first substrate, and wherein the frit seal extends along the peripheral edge of the first edge. The electrically conductive line may be made of metal. In another segment of the device, the frit seal may further comprise a non-eclipsed portion that is not eclipsed by the electrically conductive line when viewed from the first substrate.

Still referring to the above described device, the frit seal may have a width taken in a cross-sectional plane, and the electrically conductive line may have a width taken in the cross-sectional plane, and wherein the width of the frit seal is substantially smaller than the width of the electrically conductive line. The electrically conductive line may comprise a power supply line electrically connected to the array. The electrically conductive line may comprise a portion overlapping the frit seal in substantially throughout the device such that the portion of the electrically conductive line substantially eclipses the frit seal when viewed from the first substrate.

Yet still referring to the above described device, the device may further comprise a planarization layer formed over at least part of the non-pixel region of the first substrate, wherein the frit seal does not contact the planarization layer. The device may further comprise an organic planarization layer formed over at least part of the non-pixel region of the first substrate, wherein the organic planarization layer comprises a recess exposing the electrically conductive line. The device may further comprise a plurality of thin film transistors interposed between the first substrate and the array, wherein the electrically conductive line is made of a material used in the plurality of thin film transistors.

Another aspect of the invention provides a method of making an organic light emitting device. The method includes providing an unfinished device comprising a first substrate, an array of organic light emitting pixels formed over the first substrate, and an electrically conductive line formed over the first substrate and not overlapping the array, further providing a second substrate, and interposing a frit between the first and second substrates such that the array is interposed between the first and second substrates, that the frit surrounds the array and that a portion of the electrically conductive line overlaps the frit in a segment of the device, whereby the portion of the electrically conductive line substantially eclipses the frit in the segment. The method further includes melting and resolidifying at least part of the frit so as to interconnect the unfinished device and the second substrate via the frit, wherein the frit connects to the electrically conductive line with or without a material therebetween, and wherein the frit connects to the second substrate with or without a material therebetween.

In the above described method, interposing may comprise contacting the frit with the portion of the electrically conductive line and the second substrate. The unfinished device may further comprise a planarization layer generally formed over the electrically conductive line with an opening exposing part of the conductive line, and wherein interposing the frit comprises contacting the frit with the electrically conductive line through the opening. Providing the unfinished device may further comprise providing the planarization layer over the electrically conductive line, and selectively etching the planarization layer to form the opening. The melting may comprise irradiating a laser beam or infrared ray to at least part of the frit. The interposing of the frit may comprise forming the frit over at least one of the first and second substrates, and arranging the first and second substrate so as to interpose the frit therebetween. Forming the frit may comprise screen-printing or dispensing a material of the frit over at least one of the first and second substrates. The unfinished device may further comprise one or more additional arrays of organic light emitting pixels and one or more additional electrically conductive lines formed over the first substrate.

Still referring to the above described method, the method may further include forming one or more additional frits between the first and second substrates such that each additional frit surrounds one of the additional arrays and contacts a portion of one of the additional electrically conductive lines. The one of the additional electrically conductive lines may substantially eclipse the additional frit. The method may further include cutting the resulting product including the additional arrays into two or more pieces, where one of the pieces comprises the frit and the array interposed between the first and second substrate.

BRIEF DESCRIPTION OF THE DRAWINGS

The above and other features of the present invention will be described in reference to certain exemplary embodiments thereof with reference to the attached drawings in which.

DETAILED DESCRIPTION OF CERTAIN INVENTIVE EMBODIMENTS

Figure 1:
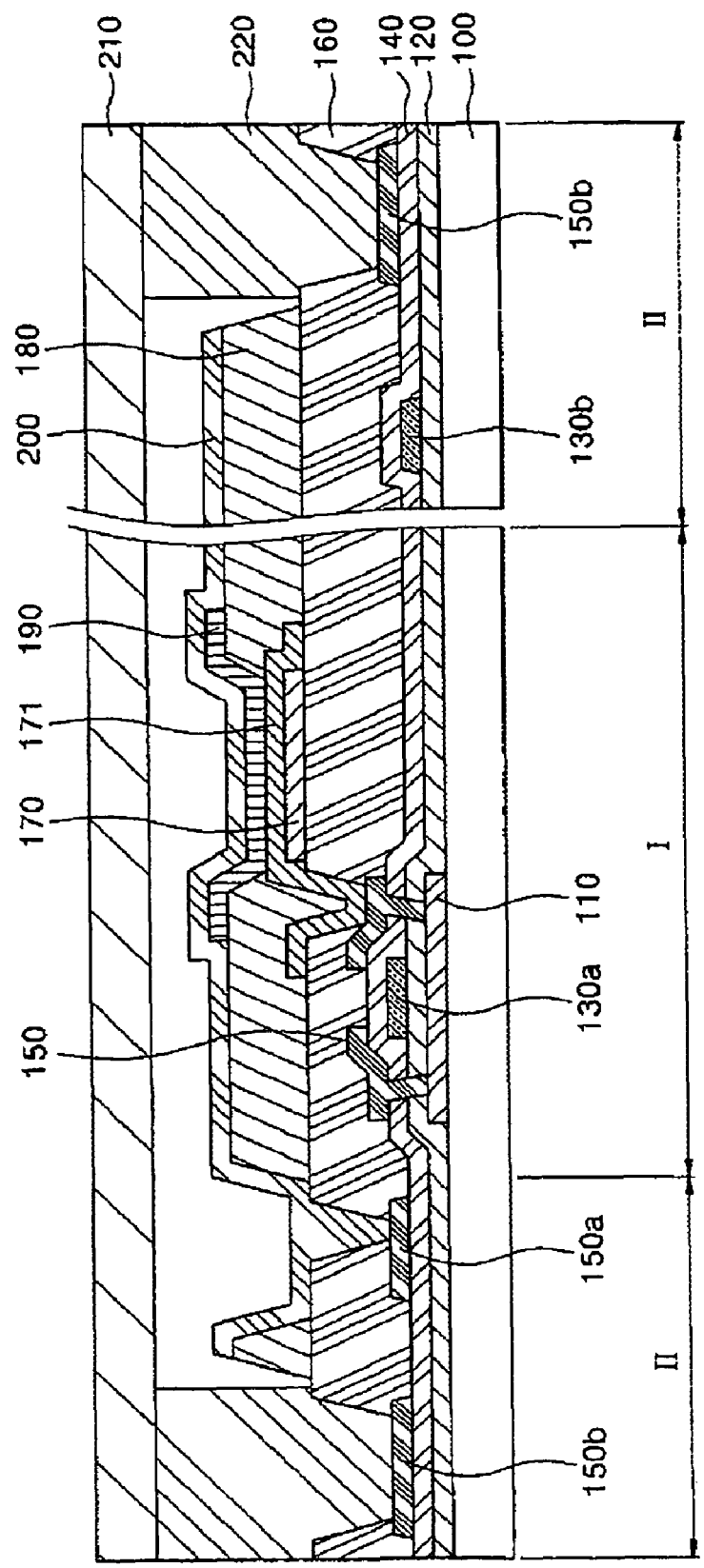
FIG. 1 is a cross-sectional view of an organic light emitting display according to an embodiment.

The present invention will now be described more fully hereinafter with reference to the accompanying drawings, in which some embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like reference numerals designate like elements throughout the specification.

An organic light emitting display (OLED) is a display device comprising an array of organic light emitting diodes. Organic light emitting diodes are solid state devices which include an organic material and are adapted to generate and emit light when appropriate electrical potentials are applied.

Figure 7A:
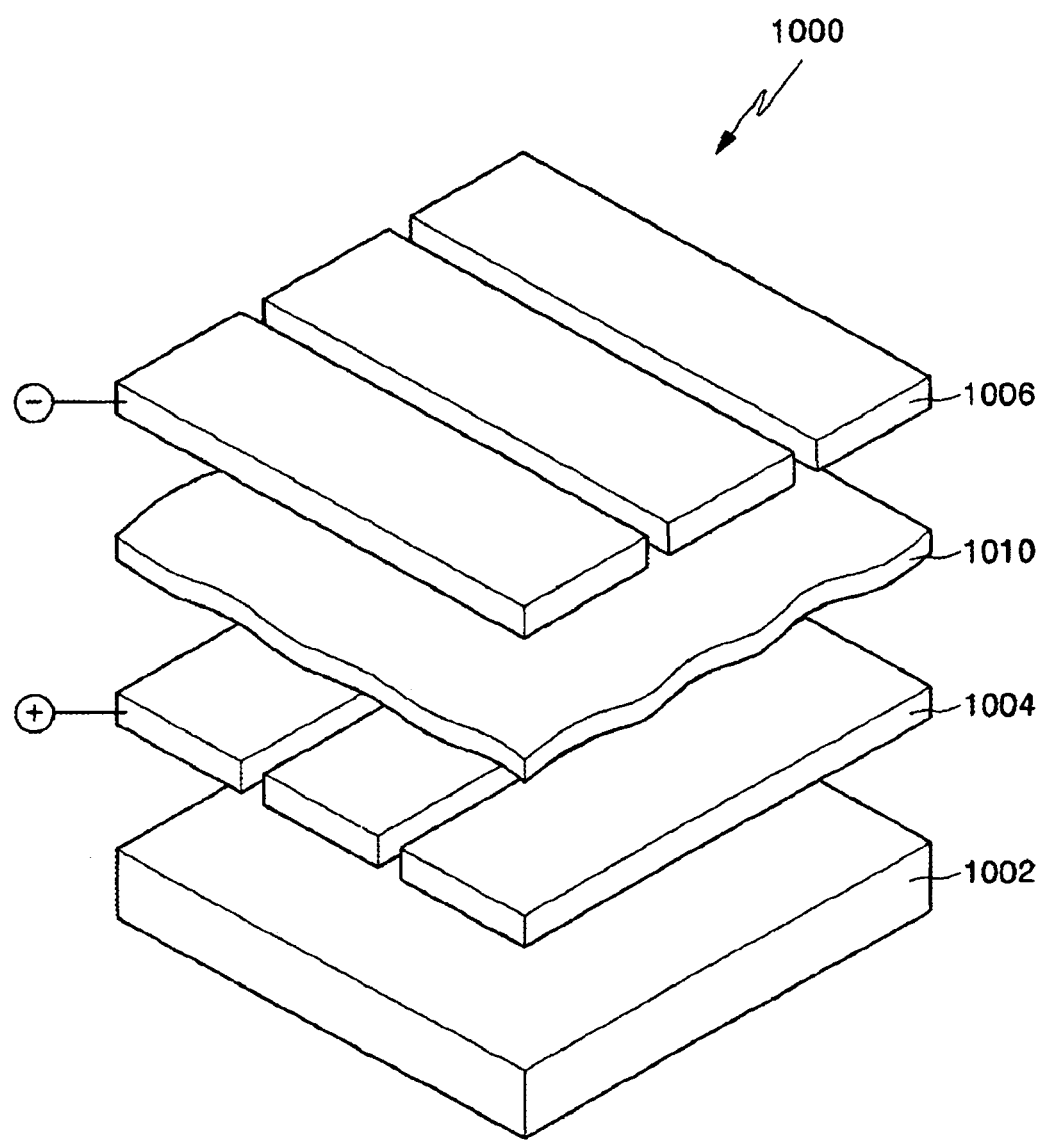
FIG. 7A is a schematic exploded view of a passive matrix type organic light emitting display device in accordance with one embodiment.
Figure 7B:
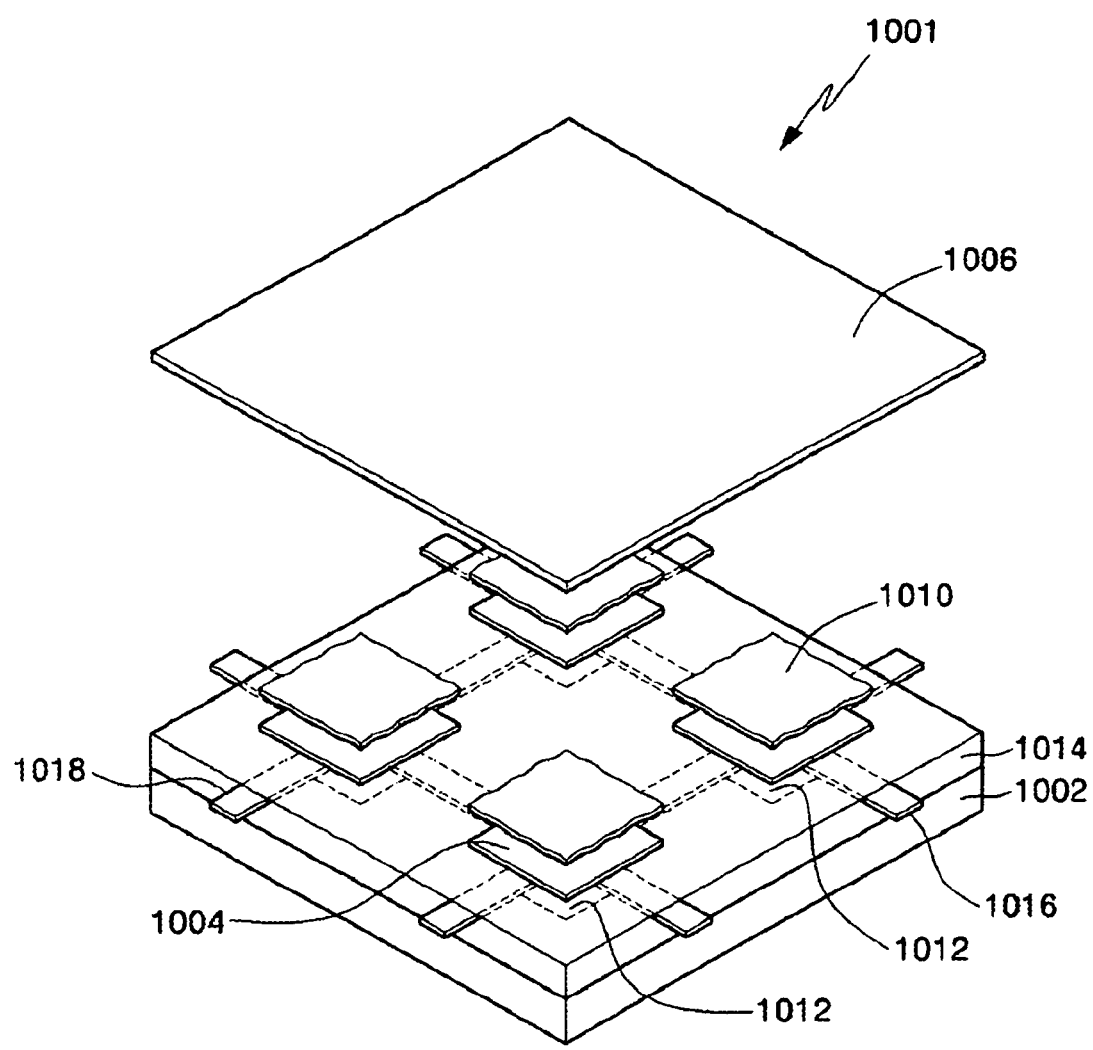
FIG. 7B is a schematic exploded view of an active matrix type organic light emitting display device in accordance with one embodiment.

OLEDs can be generally grouped into two basic types dependent on the arrangement with which the stimulating electrical current is provided. FIG. 7A schematically illustrates an exploded view of a simplified structure of a passive matrix type OLED 1000. FIG. 7B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 7A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply select signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT.

AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 7C:
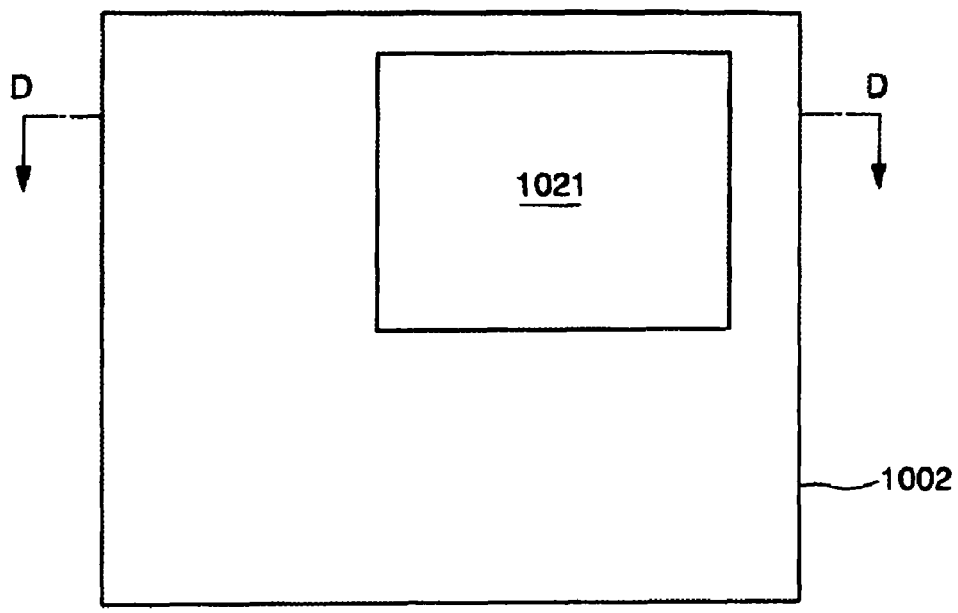
FIG. 7C is a schematic top plan view of an organic light emitting display in accordance with one embodiment.

In many embodiments, an OLED pixel array 1021 comprising a plurality of organic light emitting pixels is arranged over a substrate 1002 as shown in FIG. 7C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 7D:
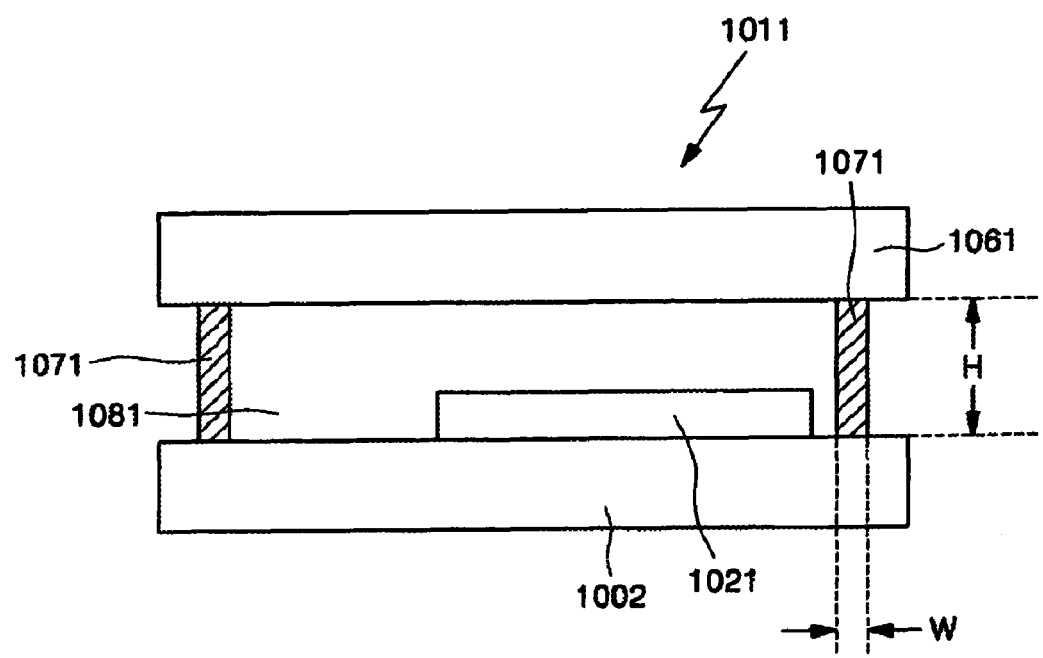
FIG. 7D is a cross-sectional view of the organic light emitting display of FIG. 7C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 7D schematically illustrates a cross-section of an encapsulated OLED device 1011 having a layout of FIG. 7C and taken along the line d-d of FIG. 7C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m²-day and to water of less than $10^{-6}$ g/m²-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 7D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 7D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 7E:
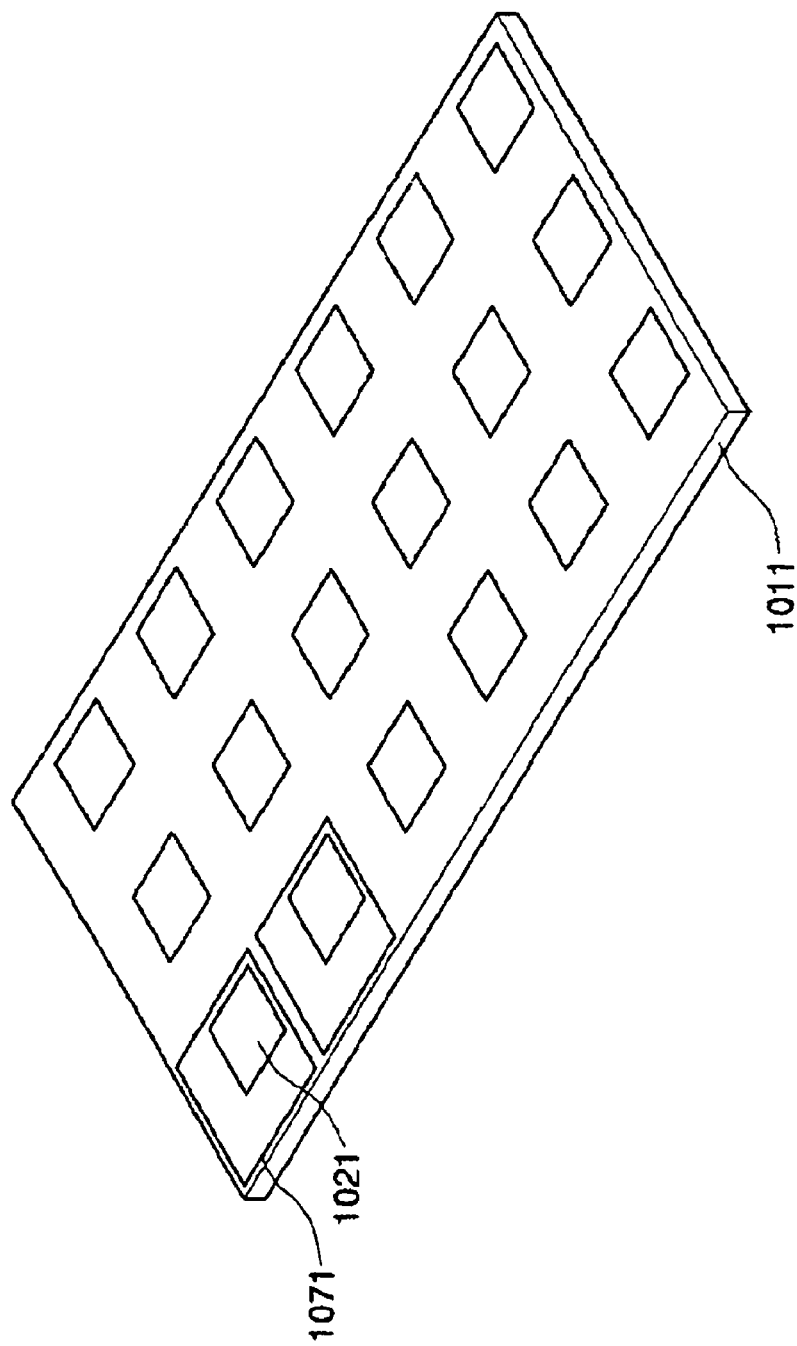
FIG. 7E is a schematic perspective view illustrating mass production of organic light emitting devices in accordance with one embodiment.

In some embodiments, OLED devices 1011 are mass produced. In an embodiment illustrated in FIG. 7E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 7D. In certain embodiments, the individual OLED devices 1011 then further undergo additional packaging operations to further improve the sealing formed by the frit seal 1071 and the top and bottom substrates 1061, 1002.

FIG. 1 is a cross-sectional view of an organic light emitting display according to an embodiment. Referring to FIG. 1, the organic light emitting display includes a semiconductor layer 110, a gate insulating layer 120, a gate electrode 130a, a scan driver 130b, an interlayer insulating layer 140, and source and drain electrodes 150, which are disposed on a substrate 100 having a pixel region I and a non-pixel region II. In addition, the organic light emitting display further includes a common power supply line 150b, and a second electrode power supply line 150a, which are formed of source and drain interconnections.

A planarization layer 160 is disposed on the entire surface of the substrate 100. The planarization layer 160 is formed of an organic material such as acryl-based resin or polyimide-based resin. The planarization layer 160 has via-holes for exposing the common power supply line 150b, the second electrode power supply line 150a, and the source and/or drain electrodes 150. The common power supply line 150b is partially exposed to enhance adhesive strength when the substrate is sealed using a glass frit.

A first electrode 171 including a reflective layer 170 is disposed on the substrate 100, and a pixel defining layer 180 is disposed on the entire surface of the substrate 100. An organic layer 190 including at least an emission layer is disposed on the first electrode 171, and a second electrode 200 is disposed thereon. An encapsulation substrate 210 is disposed opposite to the substrate 100, and the substrate 100 and the encapsulation substrate 210 are sealed with a glass frit 220, thereby forming an organic light emitting display.

However, in the foregoing embodiment, the organic light emitting display includes an organic planarization layer disposed under the glass frit for sealing the substrate so that the organic planarization layer may be damaged due to a large amount of heat generated when a laser beam is radiated to the glass frit. As a result, adhesive strength at an interface in which the glass frit is adhered to the organic planarization layer may be lowered.

Figure 2:
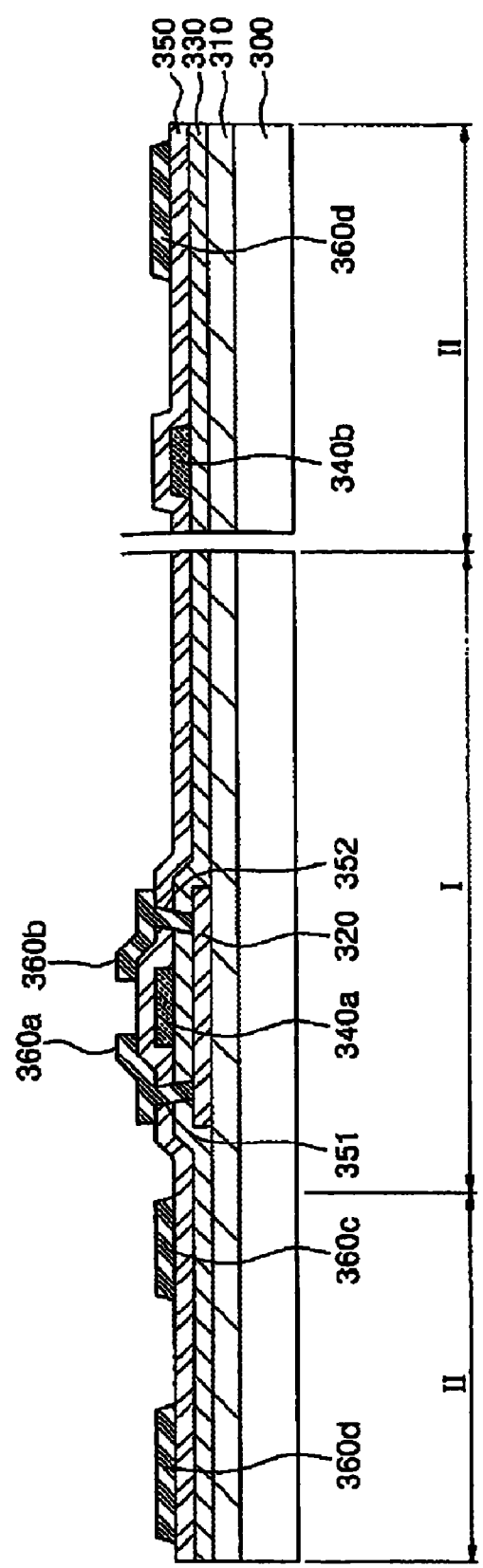
FIGS. 2 to 5 are cross-sectional views of an organic light emitting display in accordance with an embodiment.

FIGS. 2 to 5 are cross-sectional views of an organic light emitting display in accordance with another embodiment. Referring to FIG. 2, a substrate 300 including a pixel region I, and a non-pixel region II is provided. The substrate 300 may be an insulating glass substrate, a plastic substrate, or a conductive substrate.

A buffer layer 310 is formed on the surface of the substrate 300. The buffer layer 310 may be a silicon oxide layer, a silicon nitride layer, or a composite layer of silicon oxide and silicon nitride. In one aspect, the buffer layer 310 functions as a passivation layer for preventing impurities from out-diffusing from the substrate 300.

A semiconductor layer 320 is formed on the buffer layer 310 in the pixel region I. The semiconductor layer 320 may be an amorphous silicon layer or a polysilicon layer. A gate insulating layer 330 is formed on the surface of the substrate 300 and the semiconductor layer 320. The gate insulating layer 330 may be a silicon oxide layer, a silicon nitride layer, or a composite layer of silicon oxide and silicon nitride.

After forming the gate insulating layer 330, a gate electrode 340a is formed on the gate insulating layer 330 located above a portion of the semiconductor layer 320. The gate electrode 340a may be comprised of Al, Cu, and/or Cr.

An interlayer insulating layer 350 is formed on the surface of the substrate 300 and the gate electrode 340a. The interlayer insulating layer 350 may be a silicon oxide layer, a silicon nitride layer, or a composite layer of silicon oxide and silicon nitride.

The interlayer insulating layer 350 and the gate insulating layer 330 in the pixel region I are then etched to form contact holes 351 and 352 for exposing the semiconductor layer 320. Source and drain electrodes 360a and 360b are formed on the interlayer insulating layer 350 in the pixel region I connecting to the semiconductor layer 320 through the contact holes 351 and 352. The source and drain electrodes 360a and 360b may be formed of one or more materials including, for example, Mo, Cr, Al, Ti, Au, Pd and Ag.

Further, at the same time the source and drain electrodes 360a and 360b are formed, the electrically conductive line 360d is formed in the non-pixel region II. The electrically conductive line 360d may act as a common power supply line. In addition, a second electrode power supply line 360c may also be formed at the same time. Furthermore, at the same time the gate electrode 340a is formed, a scan driver line 340b may be formed in the non-pixel region II.

While a top gate thin film transistor configuration is described in this embodiment, a bottom gate thin film transistor having a gate electrode disposed under a semiconductor layer may also be formed. In addition, while the electrically conductive line, in this embodiment, is formed at the same time the source and drain electrodes are formed, the electrically conductive line may also be formed at the same time the gate electrode or the first electrode is formed.

Figure 3:
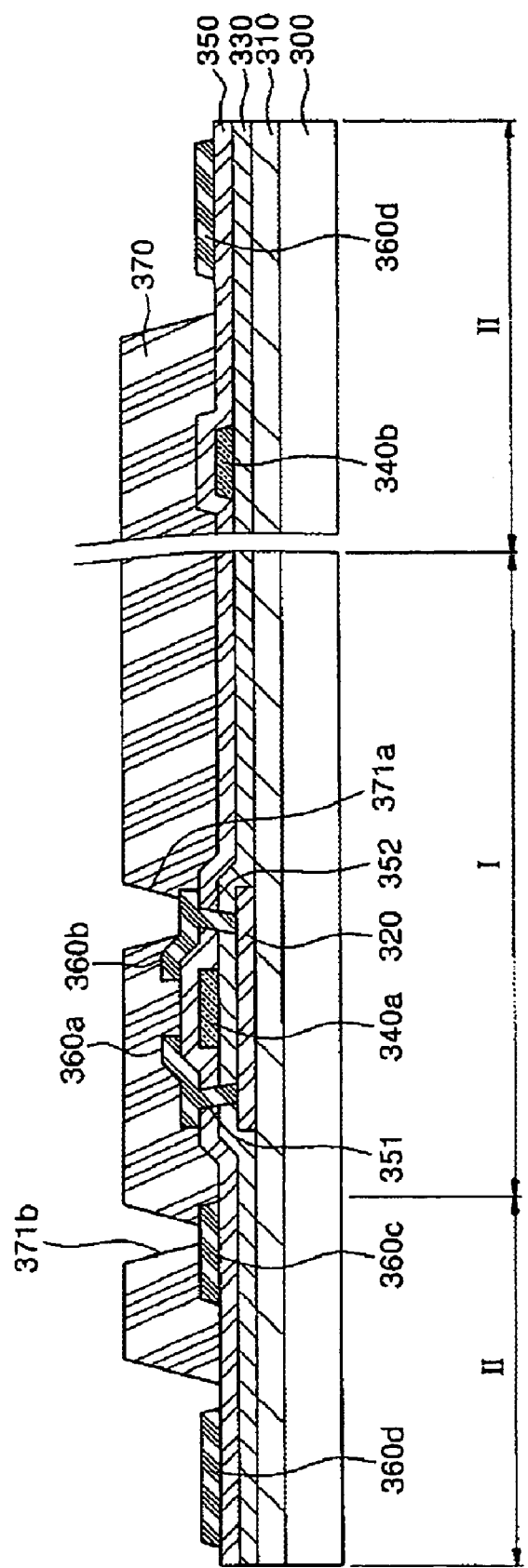

Referring to FIG. 3, an organic planarization layer 370 is formed on the surface of the substrate 300. The organic planarization layer 370 may be formed using an organic material such as acryl-based resin, polyimide-based resin, or benzocyclobutene (BCB). The organic planarization layer 370 is then etched to form via-holes 371a and 371b for exposing at least one of the source and/or drain electrodes 360a and 360b in the pixel region I, and the second electrode power supply line 360c in the non-pixel region II.

In addition, the organic planarization layer 370 in the non-pixel region II, where the electrically conductive line 360d is located, is removed by etching to form a recess exposing the electrically conductive line 360d. When the substrate is sealed using a glass frit, the glass frit is irradiated with a laser beam to adhere the substrates. At this time, if the organic planarization layer still existed under the glass frit, the planarization layer may be damaged due to a large amount of heat generated from the laser. As a result, the glass frit may be delaminated from an interface with the planarization layer to decrease adhesive strength thereof. Therefore, the organic planarization layer at the edge of the substrate 300, to which the glass frit is to be adhered, is removed to prevent the above problems.

Figure 4:
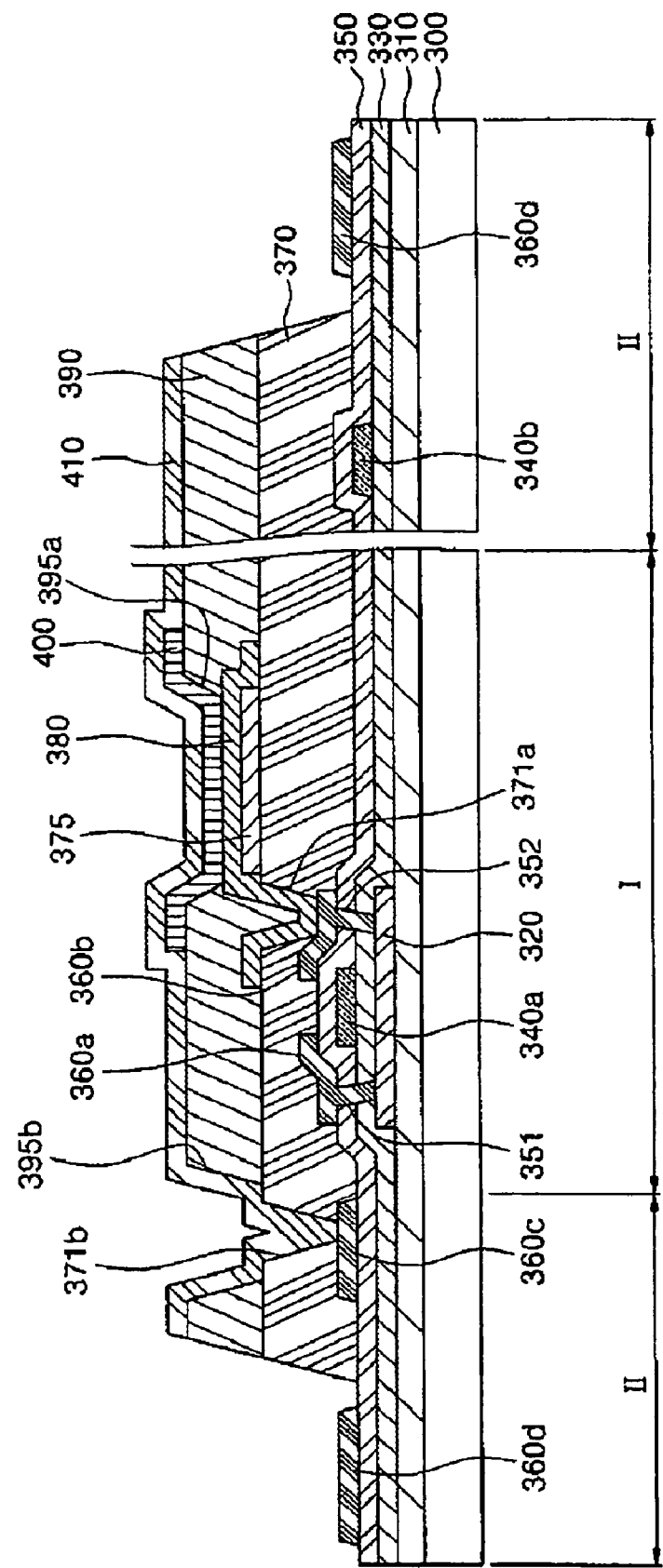

Referring to FIG. 4, a first electrode 380 including a reflective layer 375 is formed on the organic planarization layer 370 in the pixel region I. The first electrode 380 is disposed on a bottom surface of the via-hole 371 to be in contact with one of the exposed source and/or drain electrodes 360a and 360b, and extends onto the organic planarization layer 370. The first electrode 380 may be formed of indium tin oxide (ITO) or indium zinc oxide (IZO).

After forming the first electrode 380, a pixel defining layer 390 is formed on the surface of the substrate 300 including at least the first electrode 380. The pixel defining layer is formed to a thickness sufficient to fill the via-hole 371a, in which the first electrode 380 is disposed. The pixel defining layer 390 may be formed of an organic layer or an inorganic layer, preferably, an organic layer. More preferably, the pixel defining layer 390 is formed of one selected from the group including BCB, acryl-based polymer, and polyimide. The material comprising the pixel defining layer 390 preferably has high flowability such that the pixel defining layer can be evenly formed on the entire surface of the substrate.

At this time, the pixel defining layer 390 is etched to form openings 395a for exposing the first electrode 380 in the pixel region I, and a portion of the second electrode power supply line 360c in the non-pixel region II. In addition, the pixel defining layer 390 in the non-pixel region II, at which the electrically conductive line 360d is disposed, is also removed by etching.

After forming the pixel defining layer 390 and etching the opening 395a, an organic layer 400 is formed on the first electrode 380 exposed through the opening 395a. The organic layer 400 includes at least an emission layer, and may further include at least one of a hole injection layer, a hole transport layer, an electron transport layer, and an electron injection layer.

Next, a second electrode 410 is formed on the surface of the substrate 300. The second electrode 410 is a transmissive electrode, and may be formed of Mg, Ag, Al, Ca, or an alloy thereof, which is transparent and has a low work function. At this time, the second electrode 410 is etched to expose the electrically conductive line 360d in the non-pixel region II.

Figure 5:
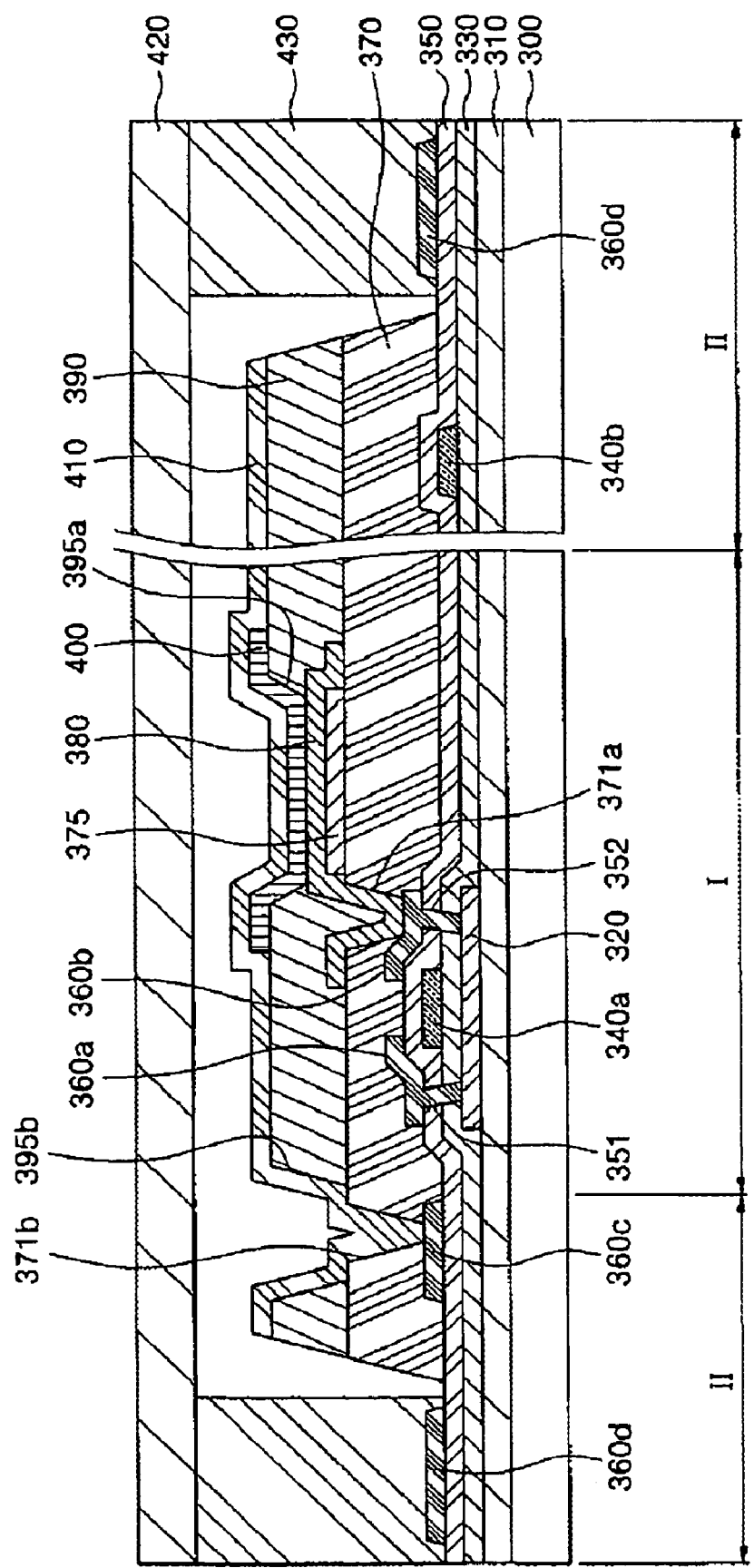

Referring to FIG. 5, an encapsulation substrate 420 opposite to the substrate 300 is provided. The encapsulation substrate 420 may be formed of an etched insulating glass or a non-etched insulating glass.

In one embodiment, a glass frit 430 is applied to the edge of the encapsulation substrate 420 opposite to the substrate 300. The glass frit 430 may be formed of material selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2)_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, and a composite thereof. The glass frit 430 may be applied by a dispensing method or a screen printing method.

In the example shown in FIG. 5, the glass frit 430 has a width larger than that of the electrically conductive line 360d. As the glass frit 430 has a larger width, the adhesive strength increases. Therefore, it is possible to protect an element from external moisture or oxygen. In this embodiment, the glass frit 430 is applied on the encapsulating substrate 420. In other embodiments, the glass frit 430 may be applied on the substrate 300, or on both the substrate 300 and the encapsulation substrate 420.

After applying the glass frit 430, the substrate 300 and the encapsulation substrate 420 are aligned and adhered to each other. At this time, the glass frit 430 is in contact with the electrically conductive line 360d and the interlayer insulating layer 350 on the substrate 300.

After contacting the substrate 300 with the encapsulation substrate 420 via the glass frit 430, the glass frit 430 is irradiated with a laser beam. The glass frit 430 is melted and solidified to adhere the substrate 300 and the encapsulation substrate 420, thereby completing the organic light emitting display of an embodiment.

It should be noted, that while the example described above in reference to FIGS. 2-5 showed a single organic light emitting pixel being encapsulated, similar procedures may be used to encapsulate an array of organic light emitting pixels. Additionally, multiple arrays of organic light emitting pixels may be encapsulated between a single substrate 300 and a single encapsulation substrate 420 and be surrounded by additional glass frits 430 (e.g., in a mass production configuration). The multiple arrays may be cut apart resulting in individual arrays encapsulated by the substrate 300, the encapsulation substrate 420 and a glass frit 430.

As described above, if the organic planarization layer is disposed under the glass frit for sealing the substrate, the organic planarization layer may be damaged due to the large amount of heat generated when the laser beam is radiated to the glass frit. As a result, the glass frit may be delaminated from an interface with the planarization layer to decrease adhesive strength thereof. On the other hand, the organic planarization layer in the area of the glass frit may be removed to prevent adhesive strength of the glass frit from being lowered.

Figure 6:
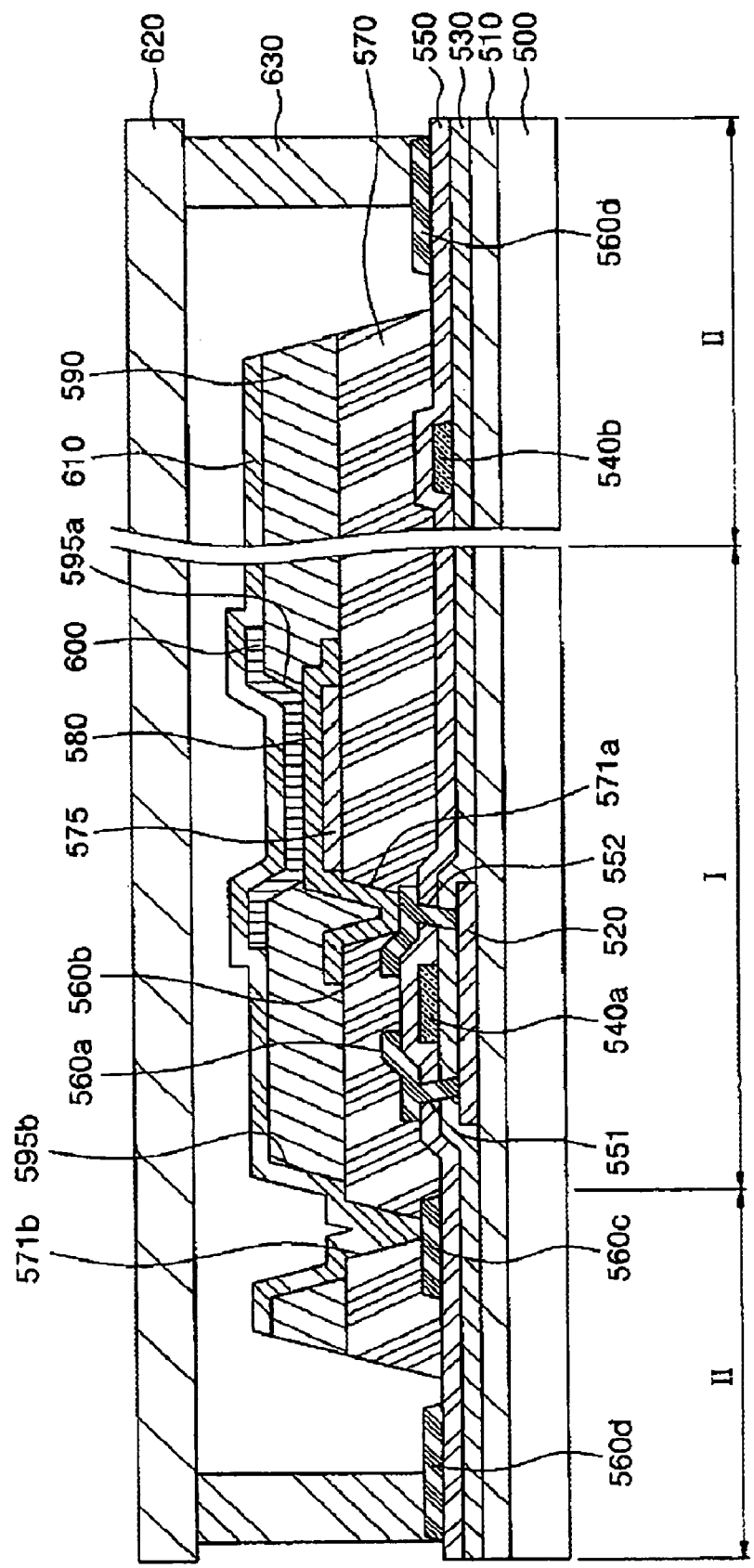
FIG. 6 is a cross-sectional view of an organic light emitting display in accordance with another embodiment.

FIG. 6 is a cross-sectional view of an organic light emitting display in accordance with another embodiment of the present invention. Referring to FIG. 6, the organic light emitting display is formed in a manner similar to the embodiment discussed above in reference to FIGS. 2-5, where a glass frit 630 is applied on an encapsulating substrate 620, and a substrate 500 is adhered to the encapsulating substrate 620. The glass frit 630 is then irradiated with a laser beam such that the glass frit 630 is melted and solidified, thereby completing the organic light emitting display.

In this embodiment, the glass frit 630 has a width equal to or smaller than that of the electrically conductive line 560d. In the embodiment shown in FIG. 5, the glass frit 430 was wider than the electrically conductive line 560d. In one aspect of this embodiment, the electrically conductive line 560d substantially eclipses or totally eclipses the glass frit 630 as viewed from the substrate 300. While the wider glass frit 430 may provide increased adhesive strength compared to the glass frit 630, a narrower glass frit such as the glass frit 630 may be sufficient, depending on the embodiment. In addition, since an organic planarization layer does not exist under the glass frit (either the glass frit 430 or the glass frit 630), it is possible to prevent the adhesive strength of either of the glass frits 430 or 630 from being lowered.

In this embodiment, the glass frit 630 is applied on the encapsulating substrate 620. In other embodiments, the glass frit 430 may be applied on the substrate 500, or on both the substrate 500 and the encapsulating substrate 620.

As described above, in the embodiment where the organic planarization layer is disposed under the glass frit for sealing the substrate so that the organic planarization layer may be damaged due to the large amount of heat generated when the laser beam is radiated to the glass frit. As a result, the glass frit may be delaminated from an interface with the planarization layer to decrease adhesive strength thereof. However, in other embodiments, the organic planarization layer under the glass frit is removed to prevent adhesive strength of the glass frit from being lowered. Therefore, it is possible to prevent intrusion of external moisture or oxygen to improve reliability of an element.

While the foregoing embodiments of the present invention exemplarily describe the electrically conductive line positioned at both sides of the substrate and disposed under the glass frit, the electrically conductive line may be disposed on and under the substrate and under the glass frit.

As can be seen from the foregoing, an organic light emitting display and a method of fabricating the same in accordance with the present invention can prevent adhesive strength of a glass frit from being lowered when a substrate is sealed using the glass frit, thereby improving reliability.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting device comprising:
a first substrate comprising a pixel region and a non-pixel region;
an array of organic light emitting pixels formed over the pixel region of the first substrate;
a second substrate placed over the first substrate, the array being interposed between the first and second substrates;
an electrically conductive line formed over the non-pixel region of the first substrate; and
a frit seal interposed between the first and second substrates and surrounding the array such that the array is encapsulated by the first substrate, the second substrate and the frit seal, wherein the electrically conductive line comprises a portion overlapping the frit seal in a segment of the device such that the portion of the electrically conductive line substantially eclipses the frit seal when viewed from the first substrate, wherein the frit seal contacts the electrically conductive line and wherein there is substantially no material between the frit seal and the electrically conductive line.

2. The device of claim 1, wherein the portion of the electrically conductive line substantially totally eclipses the frit seal when viewed from the first substrate.

3. The device of claim 1, wherein the device further comprises at least one layer located between the electrically conductive line and the first substrate, the at least one layer comprising an organic material.

4. The device of claim 1, wherein the electrically conductive line further comprises a portion that does not overlap the frit seal.

5. The device of claim 1, wherein the electrically conductive line extends along a first edge of the first substrate, and wherein the frit seal extends along a peripheral edge of the first edge.

6. The device of claim 1, wherein the electrically conductive line is made of metal.

7. The device of claim 1, wherein in another segment of the device, the frit seal further comprises a non-eclipsed portion that is not eclipsed by the electrically conductive line when viewed from the first substrate.

8. The device of claim 1, wherein the frit seal has a width taken in a cross-sectional plane, and the electrically conductive line has a width taken in the cross-sectional plane, and wherein the width of the frit seal is substantially smaller than the width of the electrically conductive line.

9. The device of claim 1, wherein the electrically conductive line comprises a power supply line electrically connected to the array.

10. The device of claim 1, wherein the electrically conductive line comprises a portion overlapping the frit seal in substantially throughout the device such that the portion of the electrically conductive line substantially eclipses the frit seal when viewed from the first substrate.

11. The device of claim 1, further comprising a planarization layer formed over at least part of the non-pixel region of the first substrate, wherein the frit seal does not contact the planarization layer.

12. The device of claim 1, further comprising an organic or inorganic planarization layer formed over at least part of the non-pixel region of the first substrate, wherein the organic planarization layer comprises a recess exposing the electrically conductive line.

13. The device of claim 1, further comprising a plurality of thin film transistors interposed between the first substrate and the array, wherein the electrically conductive line is made of a material used in the plurality of thin film transistors.

14. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

15. A method of making the organic light emitting device of claim 1, the method comprising:
 providing an unfinished device comprising the first substrate;
 further providing the second substrate;
 interposing a frit between the first and second substrates such that the array is interposed between the first and second substrates, that the frit surrounds the array and that a portion of the electrically conductive line overlaps the frit in a segment of the device; and
 melting and resolidifying at least part of the frit so as to form the fit seal that interconnects the unfinished device and the second substrate, wherein the frit seal connects to the electrically conductive line with or without a material therebetween, and wherein the frit seal connects to the second substrate with or without a material therebetween.

16. The method of claim 15, wherein interposing comprises contacting the frit with the portion of the electrically conductive line and the second substrate.

17. The method of claim 15, wherein the unfinished device further comprises a planarization layer generally formed over the electrically conductive line with an opening exposing part of the conductive line, and wherein interposing the frit comprises contacting the frit with the electrically conductive line through the opening.

18. The method of claim 17, wherein providing the unfinished device comprises:
 providing the planarization layer over the electrically conductive line; and
 selectively etching the planarization layer to form the opening.

19. The method of claim 15, wherein the melting comprises irradiating a laser beam or infrared ray to at least part of the frit.

20. The method of claim 15, wherein interposing the frit comprises:
 forming the frit over at least one of the first and second substrates; and
 arranging the first and second substrate so as to interpose the frit therebetween.

21. The method of claim 20, wherein forming the frit comprises screen-printing or dispensing a material of the frit over at least one of the first and second substrates.

22. The method of claim 15, wherein the unfinished device further comprises one or more additional arrays of organic light emitting pixels and one or more additional electrically conductive lines formed over the first substrate;
 wherein the method further comprises forming one or more additional frits between the first and second substrates such that each additional fit surrounds one of the additional arrays and contacts a portion of one of the additional electrically conductive lines.

23. The method of claim 22, wherein the one of the additional electrically conductive lines substantially eclipses the additional frit.

24. The method of claim 22, further comprising cutting the resulting product of claim 22 into two or more pieces, wherein one of the pieces comprises the frit and the array interposed between the first and second substrate.

* * * * *

UNITED STATES PATENT AND TRADEMARK OFFICE
CERTIFICATE OF CORRECTION

PATENT NO. : 8,164,257 B2
APPLICATION NO. : 11/540103
DATED : April 24, 2012
INVENTOR(S) : Choi et al.

Page 1 of 1

It is certified that error appears in the above-identified patent and that said Letters Patent is hereby corrected as shown below:

At column 12, line 40, please delete "$(B_2)_3$)," and insert --$(B_2O_3)$,--, therefor.

At column 15, line 40, please delete "fit" and insert --frit--, therefor.

At column 16, line 34, please delete "fit" and insert --frit--, therefor.

Signed and Sealed this
Twelfth Day of March, 2013

Teresa Stanek Rea
*Acting Director of the United States Patent and Trademark Office*